(12) United States Patent
Ranganathan et al.

(10) Patent No.: US 7,477,100 B2
(45) Date of Patent: Jan. 13, 2009

(54) METHOD AND SYSTEM FOR SINGLE ENDED TO DIFFERENTIAL ENDED DEMODULATION

(75) Inventors: Sumant Ranganathan, Sunnyvale, CA (US); Tom W. Kwan, Cupertino, CA (US); Hung-Sung Li, Sunnyvale, CA (US)

(73) Assignee: Broadcom Corporation, Irvine, CA (US)

( * ) Notice: Subject to any disclaimer, the term of this patent is extended or adjusted under 35 U.S.C. 154(b) by 33 days.

(21) Appl. No.: 11/115,191

(22) Filed: Apr. 27, 2005

(65) Prior Publication Data

US 2005/0243893 A1    Nov. 3, 2005

Related U.S. Application Data

(60) Provisional application No. 60/565,534, filed on Apr. 27, 2004.

(51) Int. Cl.
*H03D 3/00* (2006.01)

(52) U.S. Cl. .................................... 329/315; 329/327
(58) Field of Classification Search ................. 329/315, 329/327; 327/104
See application file for complete search history.

(56) References Cited

U.S. PATENT DOCUMENTS

| | | | | |
|---|---|---|---|---|
| 2,562,912 A | * | 8/1951 | Hawley | 324/87 |
| 3,600,691 A | * | 8/1971 | Caywood, Jr. | 327/41 |
| 4,303,888 A | * | 12/1981 | Claverie | 329/327 |
| 4,514,690 A | * | 4/1985 | Miller et al. | 324/225 |
| 6,975,259 B1 | * | 12/2005 | Jensen | 341/143 |

* cited by examiner

*Primary Examiner*—Robert Pascal
*Assistant Examiner*—Levi Gannon
(74) *Attorney, Agent, or Firm*—Sterne, Kessler, Goldstein & Fox P.L.L.C.

(57) ABSTRACT

Provided are a method and system for demodulating a signal. The method includes receiving the signal along first and second signal paths within a demodulator having a common starting point. Impedance values along each of the paths are changed alternately in synchronism.

17 Claims, 6 Drawing Sheets

METHOD AND SYSTEM FOR SINGLE ENDED TO DIFFERENTIAL ENDED DEMODULATION

CROSS-REFERENCE TO RELATED APPLICATIONS

This application claims the benefit of U.S. Provisional Application No. 60/565,534, filed Apr. 27, 2004, which is incorporated herein in its entirety by reference.

BACKGROUND OF THE INVENTION

1. Field of the Invention

The present invention relates to the field of capacitive sensing. In particular, the present invention is related to using a variable gain amplification system as one component to sense a change in physical phenomenon occurring at the terminals of a capacitive sensor.

2. Related Art

Capacitive sensors can sense changes related to physical phenomenon (e.g., pressure, acceleration, proximity etc) by changing the capacitance between their terminals. By sensing this change in capacitance, the change in the physical phenomenon can be measured. Using conventional techniques, however, these measurements are not as accurate as needed.

What is needed, therefore, is a method and system to more accurately measure the changes in capacitance of capacitive sensors that occur as a result of changes in physical phenomenon sensed by a sensor terminal. What is also needed is a method and system for measuring these changes that can be implemented within a single stage of an application specific integrated circuit (ASIC).

BRIEF SUMMARY OF THE INVENTION

Consistent with the principles of the present invention as embodied and broadly described herein, a method for demodulating a signal includes receiving the signal along first and second signal paths within a demodulator having a common starting point. Impedance values along each of the paths are changed alternately in synchronism.

Further embodiments, features, and advantages of the present invention, as well as the structure and operation of the various embodiments of the present invention are described in detail below with reference to the accompanying drawings.

BRIEF DESCRIPTION OF THE DRAWINGS/FIGURES

The accompanying drawings, which are incorporated in and constitute part of the specification, illustrate embodiments of the present invention and, together with the general description given above and the detailed description of the embodiments given below, serve to explain the principles of the invention. In the drawings:

FIG. 1 is a block diagram illustration of a sensing mechanism constructed in accordance with an embodiment of the present invention;

FIG. 2 provides a more detailed schematic illustration of the demodulator used in the illustration of FIG. 1;

DETAILED DESCRIPTION OF THE INVENTION

The following detailed description of the present invention refers to the accompanying drawings that illustrate exemplary embodiments consistent with this invention. Other embodiments are possible, and modifications may be made to the embodiments within the spirit and scope of the invention. Therefore, the detailed description is not meant to limit the invention. Rather, the scope of the invention is defined by the appended claims.

It would be apparent to one of skill in the art that the present invention, as described below, may be implemented in many different embodiments of software, hardware, firmware, and/or the entities illustrated in the figures. Any actual software code with the specialized control of hardware to implement the present invention is not limiting of the present invention. Thus, the operational behavior of the present invention will be described with the understanding that modifications and variations of the embodiments are possible, given the level of detail presented herein.

In the present invention, complex functions are combined and performed in a single circuit stage within an ASIC. Functions such as demodulation, direct current (DC) offset cancellation, programmable gain amplification, analog-to-digital conversion, which are conventionally spread across multiple circuit stages, are achieved in this single circuit stage. The use of a single stage reduces system power and conserves valuable real estate on the ASIC chip. Additionally, the present invention incorporates DC offset cancellation before an ADC, which helps to maximize signal dynamic range within the ADC.

Figure 1:
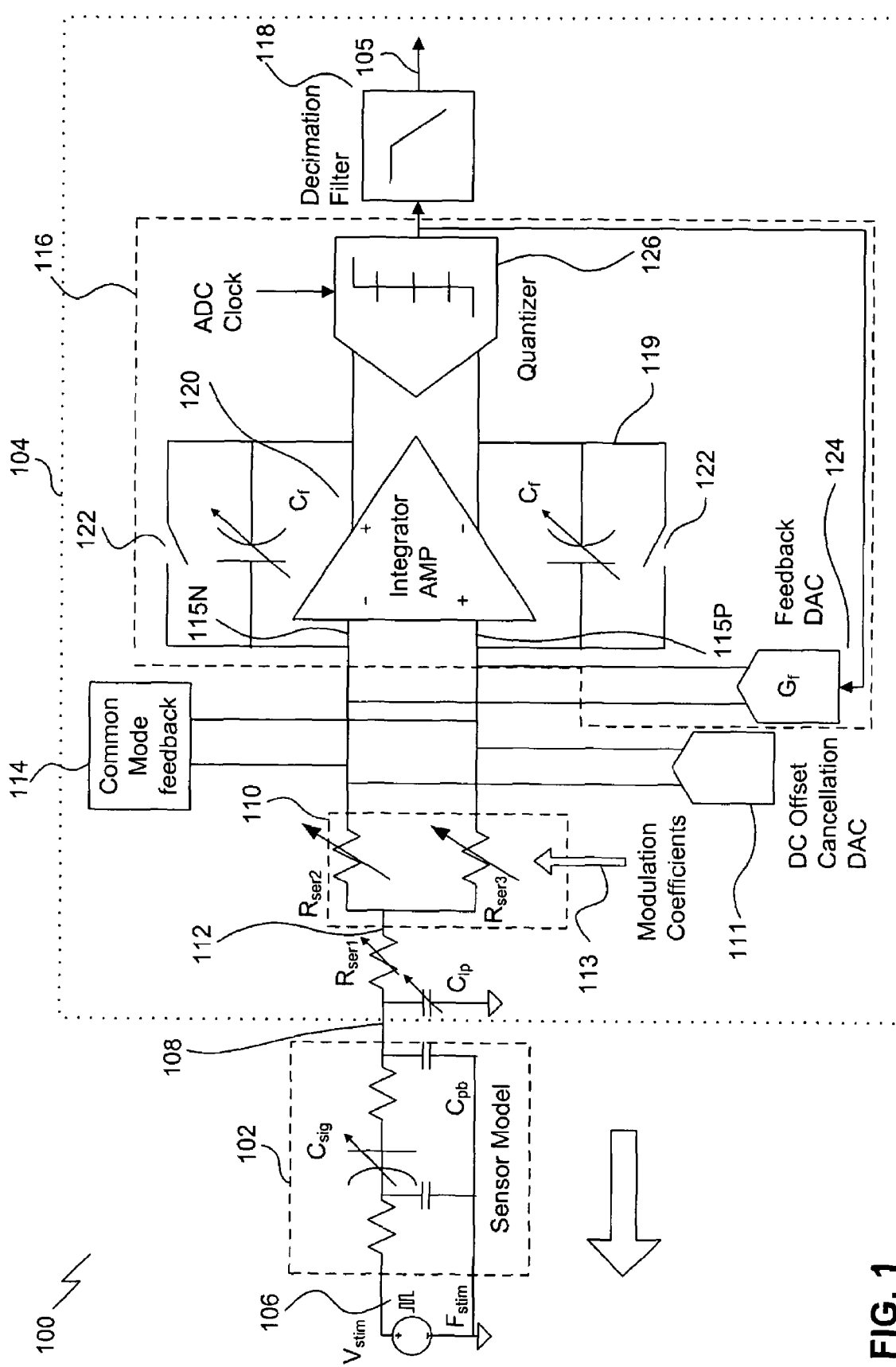

FIG. 1 is a schematic illustration of an exemplary sensing mechanism 100 constructed in accordance with an embodiment of the present invention. In FIG. 1, the sensing mechanism 100 includes a conventional capacitive sensor model 102 that senses a change in a physical phenomenon. This physical phenomenon can include, for example, changes in pressure, changes in acceleration, and changes in proximity, to name a few. The sensor model 102 provides the sensed physical phenomenon to a sensor interface circuit 104, in the exemplary form of a modulated charge. Although the sensor model 102 is depicted in FIG. 1 as a capacitive sensor, many other varieties of sensors can be used. The sensor interface circuit 104 is configured to accurately measure changes in the sensed physical phenomenon, based upon the modulated charge, and produce a digital output signal 105 representative of the changes.

More specifically, the capacitive sensor 102 is excited using a square wave 106 having a DC voltage $V_{stim}$ stimulated to oscillate at frequency $F_{stim}$. The excitation waveform 106 can also be a sine wave or some other signal source. The excitation waveform 106 is modulated by multiplication with capacitance $C_{sig}$ and a corresponding signal is provided at a sensor output port 108 in the form of a modulated signal charge.

In the exemplary sensing mechanism 100 of FIG. 1, the sensor interface circuit 104 is an ASIC that includes a variable resistor $R_{ser1}$ and a variable capacitor $C_{1p}$, along with a demodulator 110. The ASIC 104 also includes a DC offset cancellation digital to analog converter (DAC) 111, a common mode feedback circuit 114, an analog to digital converter (ADC) 116, and a decimation filter 118. The ADC 116 includes an integrator 119 including an integrator amplifier 120, switches 122, and capacitors Cf.

The variable resistor $R_{ser1}$, the variable capacitor $C_{1p}$, and sensor parasitic capacitance $C_{pb}$ form a low pass filter. This low pass filter rejects out of band noise signals that might be present at multiples of $F_{stim}$. These out of band noise signals are filtered because they would otherwise be demodulated back down to DC and potentially corrupt usable signal components within the modulated charge. The values of $R_{ser1}$, $C_{1p}$ are programmable to compensate for any changes in parasitic components of the sensor model 102.

The demodulator 110, provided to demodulate the signal from the frequency $F_{stim}$ down to DC, receives an output signal from the low pass filter via a demodulator input port 112. The demodulator 110 can be implemented using simple square wave demodulation principles or can utilize a more complex demodulation scheme, for example, a pseudo random binary sequence generator. A more complex demodulation scheme can be helpful in improving rejection of noise sources present at image frequencies of the $F_{stim}$ (integer multiples of $F_{stim}$).

In the exemplary embodiment of FIG. 1, the demodulator 110 is implemented using passive component switching as opposed to more conventional techniques, such as active multiplication. Passive component switching provides demodulation with very little additional system power consumption. Passive component switching entails changing impedance values of passive resistors, within a demodulator, to achieve demodulation and shaping of the modulated input signal. Passive switching uses fewer circuit components than the conventional demodulation techniques.

By way of example, for a square wave stimulus, such as the square wave 106, the signal charge pumped into the ASIC 104 is $\pm V_{stim} * C_{sig}$ (+ve charge when $V_{stim}$ goes from 0 to +V and −ve charge when $V_{stim}$ goes back from +V to 0). This signal is demodulated by varying resistors within the demodulator, such as conceptual resistors $R_{ser2}$ and $R_{ser3}$. When both resistors $R_{ser2}$ and $R_{ser3}$ are equal, a zero differential signal charge flows into integrator summing junctions 115p and 115n. Each of $R_{ser2}$, and $R_{ser3}$ can vary from $R_{min}$ to a very large value.

In the present invention, for example, the impedance $R_{min}$ is based upon an expected gain. For square wave demodulation, when $V_{stim}$ goes from 0 to +V and back to 0, the resistor $R_{ser3}$ is changed from a very large value to $R_{min}$, and then back to very large value. At the same time $R_{ser2}$ is changed from $R_{min}$ to a very large value, and then back to $R_{min}$. This effectively swings the signal current from the summing junction 115n, to the summing junction 115p, then back to the summing junction 115n.

This process is accomplished synchronously with the change in $V_{stim}$, while accounting for any delay from when $V_{stim}$ transitions to when the signal reaches the chip. This basically routes the positive signal charge to +ve summing junction 115p and the negative charge to the −ve summing junction 115n, effectively demodulating the signal from $F_{stim}$ down to DC. For more complex demodulations schemes, the value of $R_{ser2}$ and $R_{ser3}$ are smoothly changed from $R_{min}$ to the very large value and back using programmable modulation coefficients (stored in a programmable on-chip memory device) provided to the demodulator 110 across a bus 113. This can be done at a rate that is many multiples of the stimulus frequency $F_{stim}$. Use of demodulator coefficients helps to filter any noise source present near multiples of $F_{stim}$, from modulating back to DC.

Although operation of the demodulator 110 of FIG. 1 was described based upon use of a square wave signal, other waveform shapes can be accommodated. For example, noise could easily be injected into the ASIC 104 at harmonics of the $V_{stim}$ frequency $F_{stim}$. In this example, sine wave demodulation might be more beneficial in mitigating these harmonics than square wave demodulation. Other waveform types may offer other advantages under different conditions. The present invention, however, is flexible enough to accommodate these other waveform demodulation types.

Figure 2:
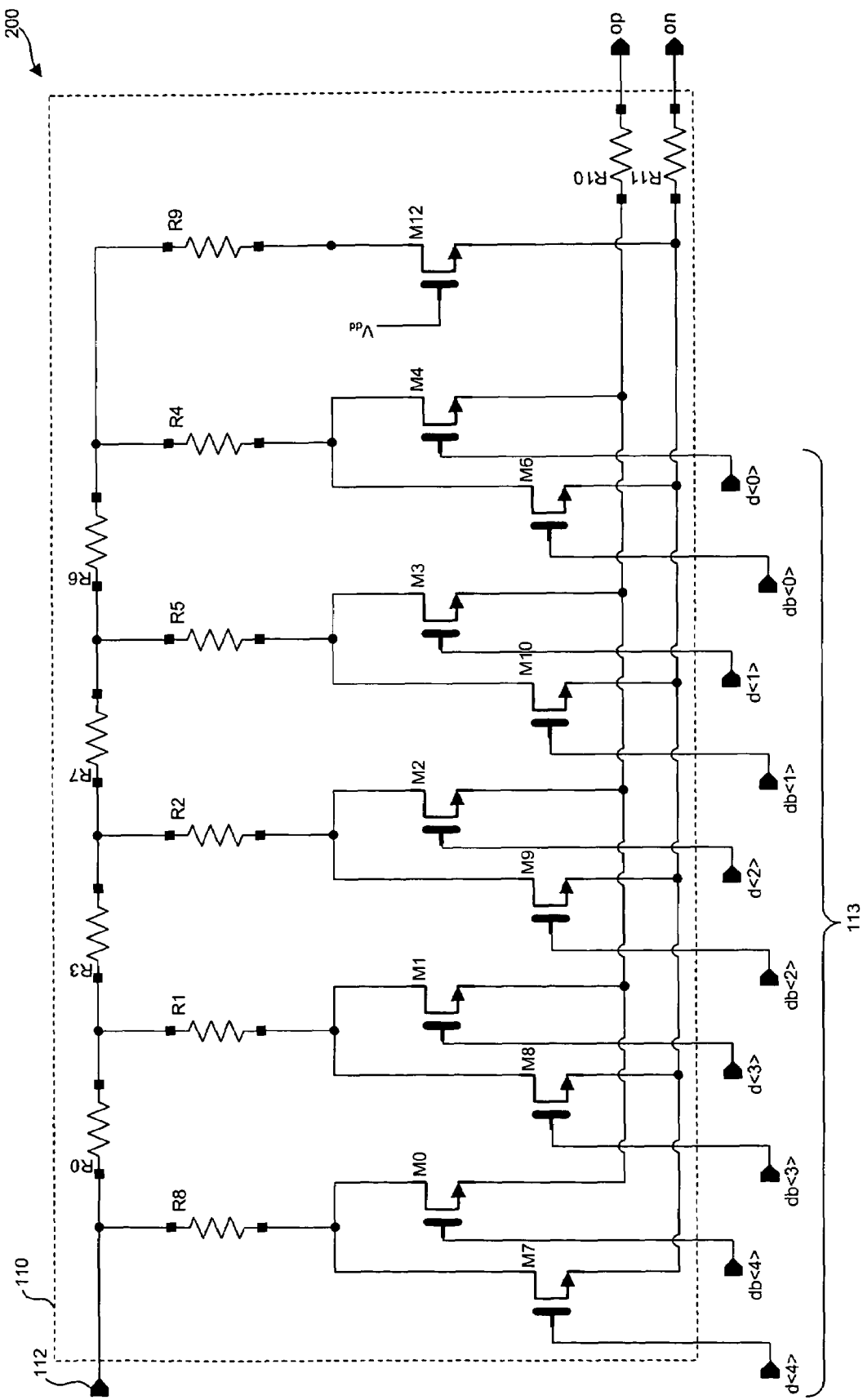

FIG. 2 provides a more detailed schematic illustration 200 of the demodulator 110. More particular, FIG. 2 is an illustration of an exemplary implementation of the conceptual resistors $R_{ser2}$ and $R_{ser3}$. The conceptual resistors $R_{ser2}$ and $R_{ser3}$ are formed by a resistor ladder comprised of actual resistors R0-R9 shown in FIG. 2, each having a component value of R2R. The resistors R0-R9 are respectively coupled to transistors M0-M12. The circuit 200 of FIG. 2 multiplies a modulated signal input at the input port 112 with demodulation DAC coefficients received via the port 113. The demodulation coefficients determine the number of levels associated with impedances values of the conceptual resistors $R_{ser2}$ and $R_{ser3}$.

The bus 113 includes a 5 bit port d4:0 and a complimentary 5 bit port db4:0 and the corresponding 5 bit coefficients can be selectable and programmable based upon predetermined user criteria. Thus, based upon the input modulated signal and the selected coefficients, a differential representation of the input modulated signal is provided via output ports OP and ON to the ADC 116. Selection, use, and benefits of the modulation coefficients are discussed in additional detail below.

Criteria to select the modulation coefficients are determined in the following manner. During programming, a user examines the duration of one period of an expected stimulus signal frequency (e.g. $F_{stim}$). The user can then divide this period into N number of pieces, (e.g., 16, 32, or other). The demodulation coefficients are then programmed to vary the input waveform N number of times over this period. One value of the demodulation coefficients will be representative of one of the N number of pieces within each period. Next, the values of $R_{ser2}$ and $R_{ser3}$ are desirably quantized and changeable in consonance with characteristics of the desired demodulation waveform that would change or vary to match these periods.

For example, a sine wave would require relatively smooth changes and transitions around its edges. Thus a higher number of bits (e.g. 5 bits) for the coefficient value might be more suitable for achieving this smoothness than a lower number of bits (e.g. 3 bits). The number of bits is also a function of the performance required of the demodulation function. The particular coefficient values can also be selectively programmable, based upon lookup tables having values corresponding to the shape of the input signal waveform.

Figure 3:
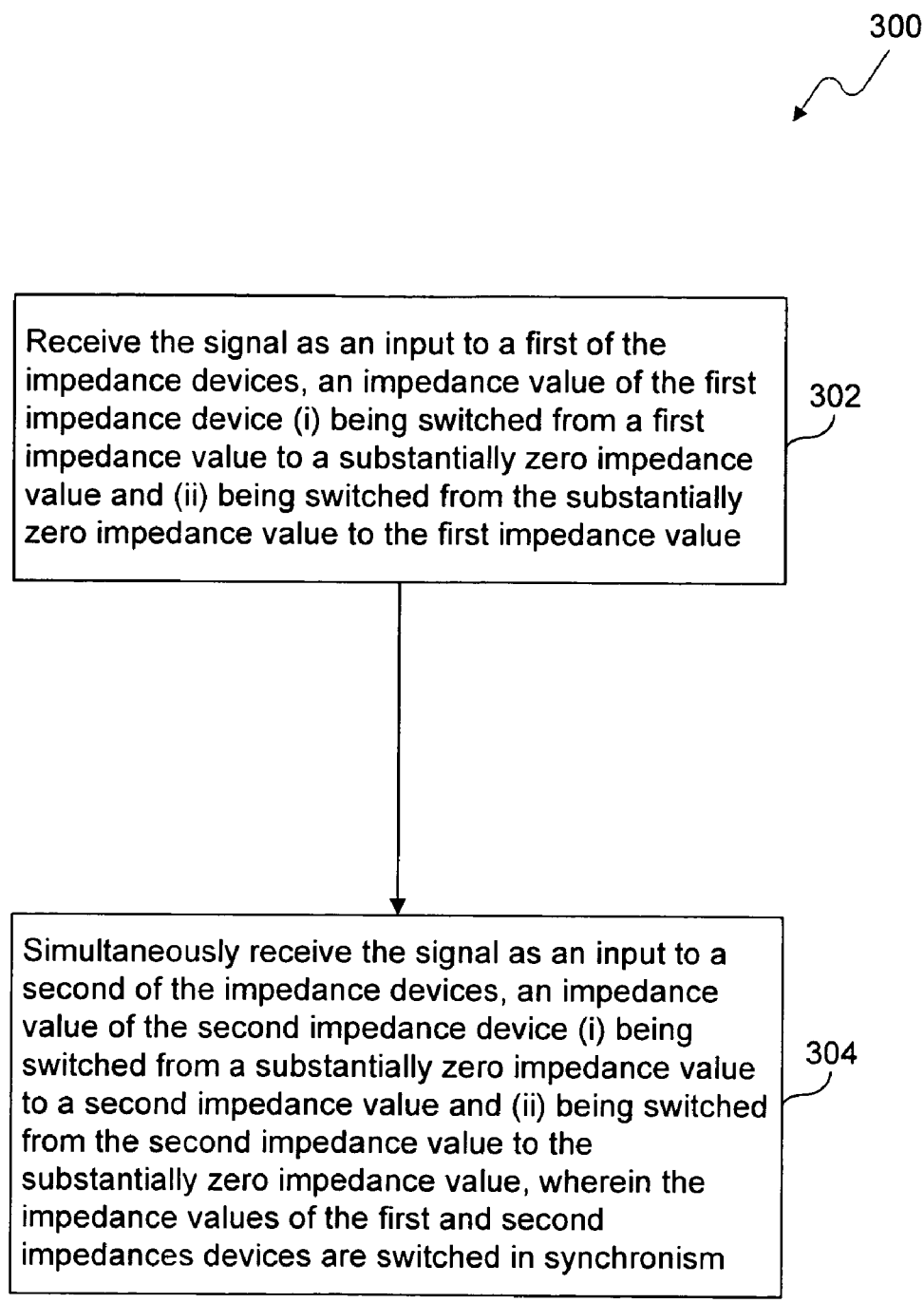
FIG. 3 is a flow chart of an exemplary method of practicing an embodiment of the present invention.

FIG. 3 is a flow chart of an exemplary method 300 of practicing an embodiment of the present invention. In the method 300, a signal is received as an input to a first of the impedance devices. An impedance value of the first impedance device (i) is changed from a first impedance value to a relatively small impedance value and (ii) is changed from the relatively small impedance value to the first impedance value, as indicated in step 302. In step 304, the signal of step 302 is simultaneously received as an input to a second of the impedance devices. An impedance value of the second impedance device (i) is changed from a relatively small impedance value to a second impedance value and (ii) is changed from the second impedance value to the relatively small impedance value. Finally, the impedance values of the first and second impedances devices are changed in synchronism.

Returning to FIG. 1, the exemplary DC cancellation DAC 111 is provided to cancel a fixed capacitance value associated, for example, with the capacitance $C_{sig}$. That is, in the absence of any physical phenomenon (e.g., physical phenomenon at ambient value), a certain amount of voltage $V_{stim}$ will be present at the input of the sensor model 102. Consequently, the voltage $V_{stim}$ will be multiplied by the capacitance $C_{sig}$ (unknown) and will therefore still produce an extraneous (unwanted) modulated charge, independent of the change in physical phenomenon. When actual physical phenomenon changes, the change may only change the amplitude of $C_{sig}$ by 20%, for example. However, it is this smaller 20% amount that the ASIC 104 must accurately measure and convert from analog to a digital value 105.

The unwanted modulated charge, which in the example above, represents 80% of the signal at the input 112 of the demodulator 110, must also be converted from analog to digital domain. Therefore, unless the unwanted modulated charge is eliminated, it will unnecessarily consume the dynamic range within the ADC 116 when it is converted to the digital domain. The offset DC cancellation DAC 111 of FIG. 1 removes this unwanted modulated charge component.

Figure 4:
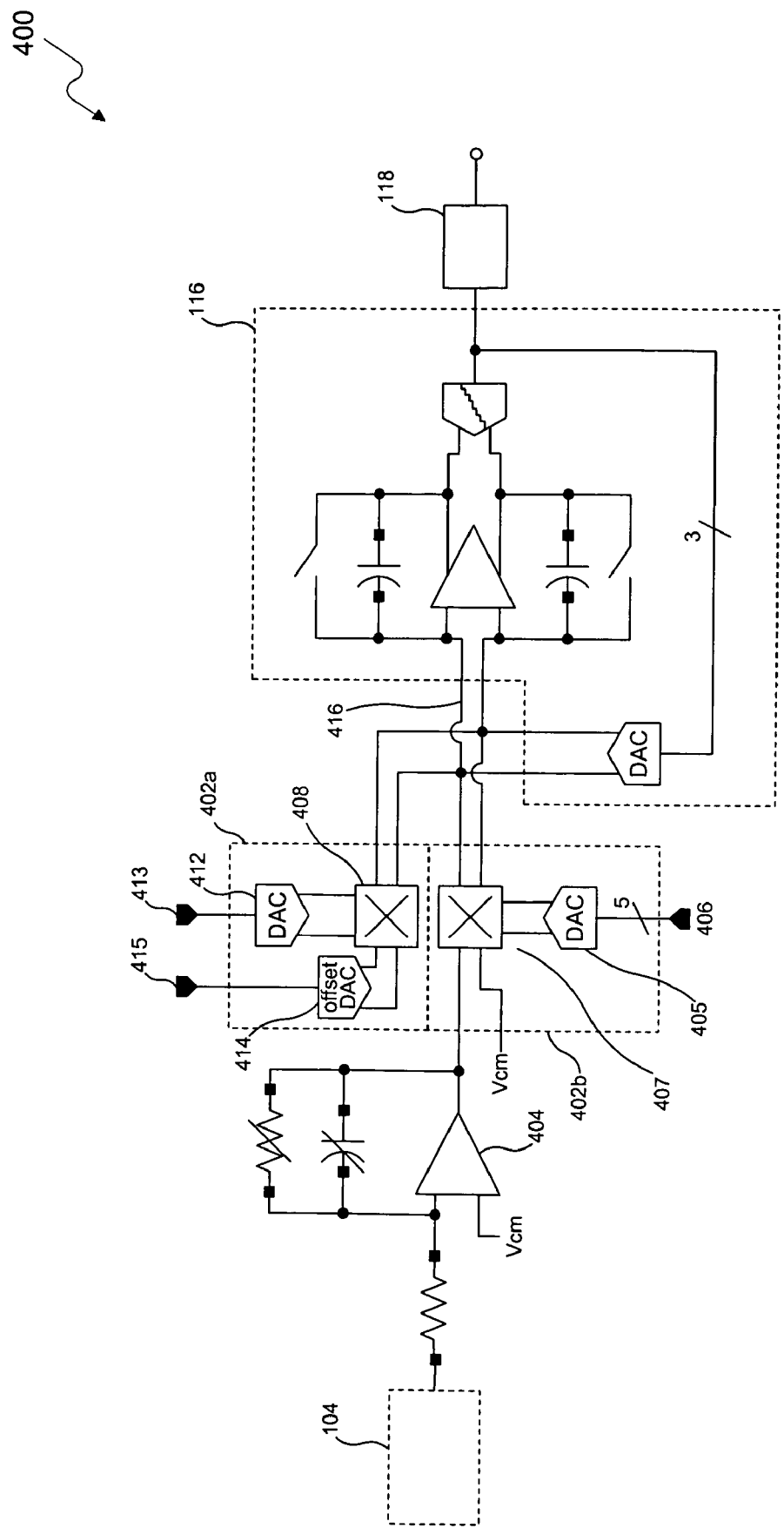
FIG. 4 is a block diagram illustration of a circuit including an DC offset cancellation mechanism constructed in accordance with another embodiment of the present invention.

FIG. 4 is a block diagram illustration of a circuit 400 including a DC offset cancellation mechanism 402a. The mechanisms 402a and 402b of FIG. 4 are provided to cancel the offset charge in correspondence with the shape of an input waveform. In the circuit 400, a modulated charge is output from a capacitive amplifier 404 and provided as an input to the signal demodulation mechanism 402b.

The signal demodulation mechanism 402b includes a multiplying DAC 405, and is coupled to a signal demodulator 407. The DAC 405 has an input port 406. A second demodulator 408, within the offset DC cancellation mechanism 402a, is coupled to a signal shaping DAC 412 having an input port 413. An offset DAC 414, having an input port 415, is similarly coupled to the second demodulator 408.

As noted above, not all of the signal component output from the sensor model 104 is wanted. Therefore, the goal of DC offset cancellation is to extract (or recover) the desirable DC component that is truly representative of the physical phenomenon. More specifically, the mechanisms 402a and 402b can determine a change in the channel capacitance as a result of the physical phenomenon being applied to the capacitive sensor 104.

For example, an overall channel capacitance ($C_{channelcapacitance}$) might be representative of 100% of the signal amplitude sensed by the sensor 104. As discussed, 20% of this amount ($C_{variable}$) might be representative of a change in acceleration. The remaining 80% is a relatively large unwanted component $C_{fixed}$, where $C_{channelcapacitance} = C_{fixed} + C_{variable}$. The goal of both the DC offset cancellation mechanism 402a and the signal demodulation mechanism 402b is to remove the $C_{fixed}$ component so that only the $C_{variable}$ component is forwarded to the ADC 116. This approach preserves the dynamic range within the ADC 116.

First, since the excitation DC voltage signal $V_{stim}$ was modulated to frequency $F_{stim}$, it must now be demodulated back down. By way of background, $V_{stim}$ requires modulation because the capacitive sensor model 102 actually changes its channel capacitance in correspondence to the sensed physical phenomenon. Modulating the excitation DC voltage signal $V_{stim}$ is one way to measure the change in channel capacitance of the sensor model 102. That is, the capacitor $C_{sig}$ is not sensitive to DC. Thus, with an unmodulated DC signal alone, no effect can be seen. In order to measure the effect, The DC signal must be excited at a certain frequency so that the capacitance of channel creates a variable signal at the output port 108 based on the value of $C_{sig}$.

In the signal demodulation mechanism 402b, the multiplying DAC 405, used to provide the desired demodulation waveform, is positioned in path with the modulated input signal. Selection of the demodulation waveform is a programmable function within the signal demodulation mechanism 402b. A demodulation waveform is desirably selected to match features associated with the input DC stimulation signal. For example, assuming the input stimulation signal is a square wave with a frequency (fundamental signal component) of about 200 kilohertz (khz), a demodulation signal in the form of a sine wave will only selectively let through only the fundamental signal component at 200 khz.

For example, if the exemplary square wave of 200 khz is closely examined, it will be noted that this signal contains component frequency signals at the fundamental frequency, the third harmonic, and all odd harmonics. Therefore, if noise sources occur at the odd harmonics, this noise can be rejected by selecting a demodulation waveform from the DAC 405 that selectively allows only the fundamental frequency component, while rejecting everything else. These waveforms can be supplied to the DAC 405 via the input port 406 and can be chosen based upon the input signal waveform and/or other predetermined user criteria. For the example above, choosing a demodulation waveform (i.e. offset waveform) in the form of a sine wave will provide proper rejection of unwanted components.

In the signal demodulation mechanism 402b, the modulated input square wave signal is received within the signal demodulator 407. This square wave signal is then multiplied by a demodulation signal provided by the DAC 405. By multiplying the square wave signal by the DAC 405 demodulation signal the output of the signal demodulator 407 becomes rectified signal with base-band content. The DC offset cancellation mechanism 402a, however, now needs to cancel 80% of this rectified signal because only 20% of this waveform represents the true change in the physical phenomenon.

To cancel the 80% portion of the rectified signal, the absolute value of the sine wave demodulation signal (provided as an input to the signal demodulator 407) is provided as an input to the second demodulator 408. The absolute value of the sine wave is taken because it resembles the rectified signal output from the signal demodulator 407. The absolute value of the sine wave demodulation signal will automatically track the envelope of the demodulation signal, enabling more accurate cancellation of the DC component over time.

Next, a known user supplied DC value is provided as an input to the offset DAC 414, via the input port 415. This known value is roughly equal to the offset value that is desired to be cancelled. This known value from the offset DAC 414 is then multiplied by the absolute value from the DAC 412, within the second demodulator 408. The output of the second demodulator 408, therefore, is an offset component in the shape of a sine wave having variable levels.

The variable level sine wave output from the demodulator 408 is subtracted from the rectified sine wave output from the demodulator 407. The difference between the outputs of the demodulators 407 and 408 is a much smaller rectified sine wave which represents the variable capacitive component $C_{variable}$. This variable capacitive component (real signal component) is provided as an input to the ADC 116 along differential input signal lines 416.

Figure 5:
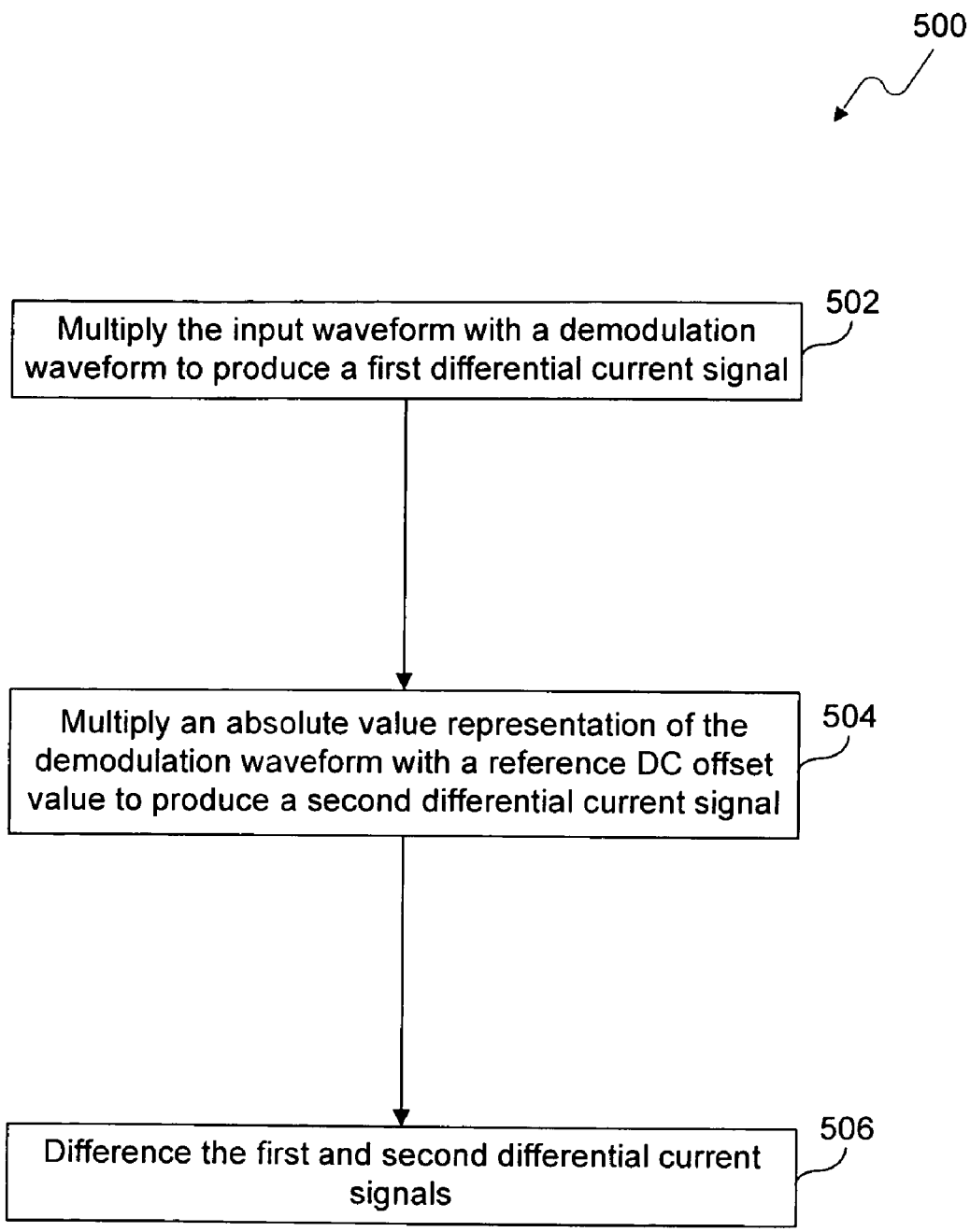
FIG. 5 is another flowchart of an exemplary method of practicing an embodiment of the present invention.

FIG. 5 is a flowchart of an exemplary method 500 of practicing the present invention in accordance with one embodiment of the present invention. In FIG. 5, an input waveform is multiplied with a demodulation waveform to produce a first differential current signal, as indicated in step 502. In step 504, an absolute value representation of the demodulation waveform is multiplied with a reference DC offset value to produce a second differential current signal. And in step 506, a difference between the first and second differential current signals is obtained.

Returning to FIG. 1, the common mode feedback circuit 114 measures the common mode at an integrator summing junctions 115p and 115n maintains the common mode to a known user selectable value, optimal for the operation of the circuit 100.

The ADC 116 of FIG. 1 performs analog to digital conversion by using a continuous time sigma delta modulator. The sigma delta modulator includes an integrator 119 includes an amplifier 120, the integrator capacitors $C_f$, and the reset switches 122. The sigma delta modulator also includes a feedback DAC 124 and a multi-bit quantizer 126. The ADC 116 is clocked using an ADC clock which, for purpose of illustration, is a multiple of $F_{stim}$.

The decimation filter 118 follows the quantizer 126 to filter any high frequency noise from the quantizer output. In the case where the ASIC 104 is used to successively sample a series of such capacitive sensors, the integrator 119 and the decimation filter 118 are reset before each new conversion. This is done by the shorting the integrator cap $C_f$ and simultaneously clearing the decimation filter 118 before every new sensor capacitance measurement. Next, the sigma delta ADC 116 runs for a variable number of $F_{stim}$ cycles, at the end of which the output of the decimation filter 118 is captured for further processing by a user.

The decimation filter 118 can also include a high pass filter to prevent low frequency noise components from corrupting the signal. By performing the analog to digital conversion in the $1^{st}$ stage, the feedback capacitance needed within the integrator 119 can be dramatically reduced since now the integrator 119 only integrates the error signal (difference between the signal and the quantized value of the signal) instead of the entire signal. This is important for applications where many channel's of this same circuitry are needed in parallel.

The feedback DAC 124 provides programmable gain by changing its gain factor $G_f$. The integrator Cap $C_f$ is also changed simultaneously such the $G_f/C_f$ is a constant. This is done to maintain the exact same transfer function for the sigma delta ADC 116 over all gains.

Figure 6:
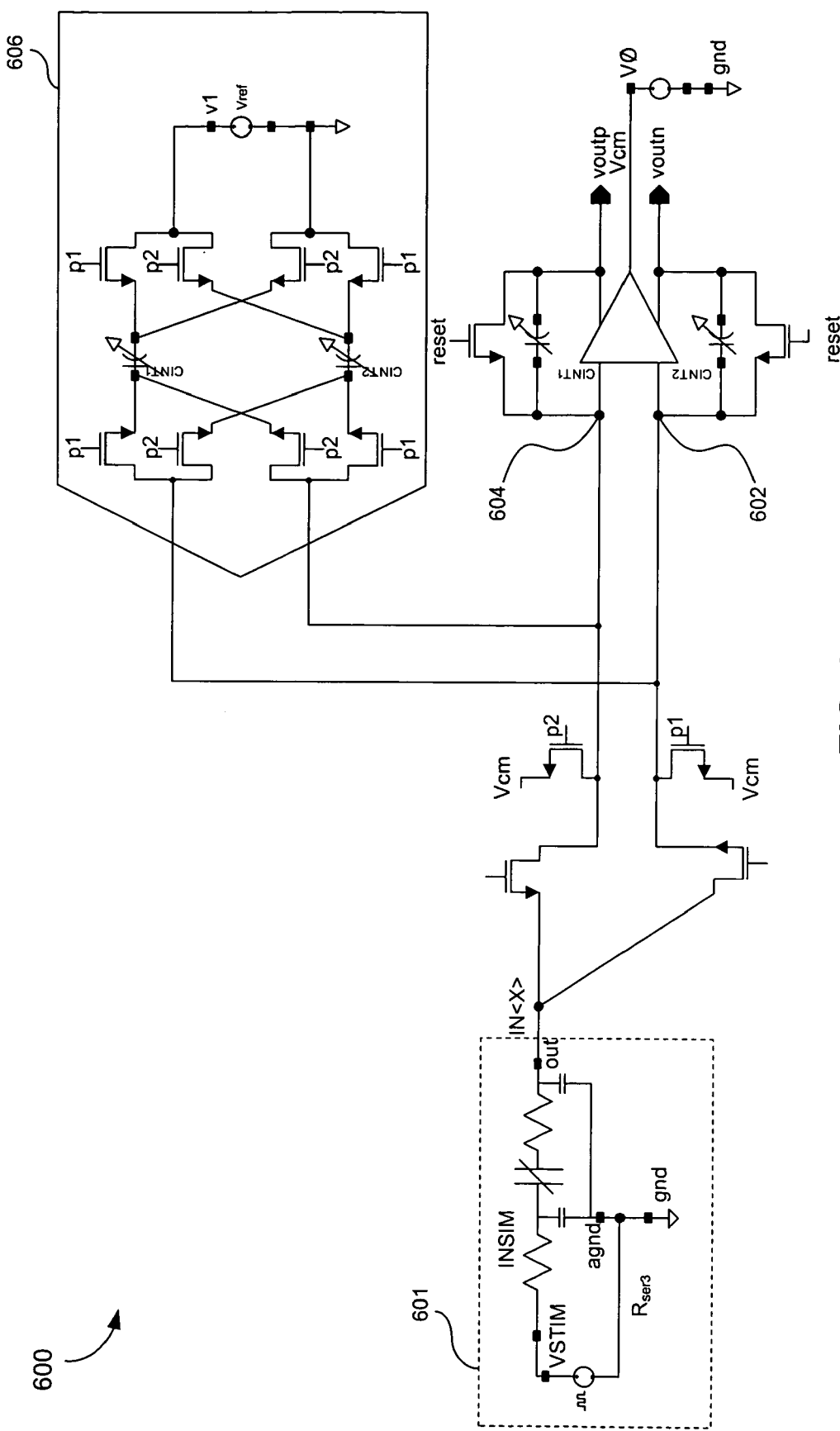
FIG. 6 is a block diagram representation of an ASIC constructed in accordance with another embodiment of the present invention.

FIG. 6 is a block diagram representation of an ASIC 600 constructed in accordance with another embodiment of the present invention. The ASIC 600 accomplishes variable gain, demodulation, signal integration/filtering and offset compensation functions. Included within the ASIC 600 is another conventional sensor model 601 for sensing change in physical phenomenon.

In FIG. 6, the positive signal charge is routed to a +ve summing junction 602 and the negative charge to a −ve summing junction 604. This is done in phase with the change in the stimulus $V_{stim}$ at the frequency $F_{stim}$. This process effectively demodulates the signal from $F_{stim}$ down to DC. In the ASIC 600, however, the integrator output continues to integrate the signal charge for a given number of $V_{stim}$ cycles after which we would then capture the integrator output could be captured using an ADC. The technique of FIG. 6 would not necessarily require a decimation filter following the ADC.

A switched-capacitor offset compensation DAC 606 is used to cancel the DC component of the signal to reduce the dynamic range requirements of the integrator. Here, the gain is varied by scaling the integrator cap $C_{INT1}$ and the $C_{DAC1,2}$ together while maintaining a fixed ratio between the two.

CONCLUSION

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What is claimed is:

1. A method for demodulating a signal, comprising (i) receiving the signal along first and second signal paths within a demodulator, the first and second signal paths having a common starting point and (ii) alternately changing impedance values in a first and a second passive device in a variable fashion within a range of values between a minimum value and a maximum value along each of the paths in synchronism, the alternately changing being in accordance with a shape of a desirable output waveform.

2. The method of claim 1, wherein the alternately changing is in consonance with one or more demodulation coefficients.

3. A method for demodulating a signal within a demodulator including two or more passive impedance devices, comprising:

receiving the signal as an input to a first of the passive impedance devices, an impedance value of the first passive impedance device (i) being changed from a first impedance value to a relatively small impedance value in a variable fashion and (ii) being changed from the relatively small impedance value to the first impedance value in a variable fashion via one or more intermediate impedance values; and simultaneously receiving the signal as an input to a second of the passive impedance devices, an impedance value of the second passive impedance device (i) being changed from a relatively small impedance value to a second impedance value in a variable fashion and (ii) being changed from the second impedance value to the relatively small impedance value in a variable fashion via one or more intermediate impedance values;

wherein the impedance values of the first and second passive impedances devices are changed in synchronism, in accordance with a shape of a desirable output waveform.

4. The method of claim 3, further comprising programming the first impedance value to be substantially equal to the second impedance value.

5. The method of claim 4, wherein the received signal is modulated at a predetermined modulation frequency; and wherein the changing occurs at a rate substantially equal to the predetermined modulation frequency.

6. The method of claim 5, wherein the changing is performed smoothly.

7. The method of claim 5, wherein the received signal is periodic.

8. The method of claim 7, wherein a demodulation signal substantially matches the periodic received signal.

9. The method of claim 4, wherein the received signal is modulated at a predetermined modulation frequency; and wherein the changing occurs at a rate that exceeds the predetermined modulation frequency.

10. The method of claim 4, wherein the received signal is modulated using a predetermined pseudo random binary sequence; and wherein the changing occurs at a rate substantially equal to the predetermined pseudo random binary sequence.

11. The method of claim 10, wherein the received signal is matched to an independent pseudo random binary sequence.

12. The method of claim 11, wherein a demodulation signal is matched to the independent pseudo random binary sequence.

13. The method of claim 3, wherein the impedance values of each of the first and second passive impedance devices is changed based on one or more demodulation coefficients.

14. An apparatus for demodulating a signal in a demodulator including two or more passive impedance devices, comprising:

means for receiving the signal as an input to a first of the passive impedance devices, an impedance value of the first passive impedance device (i) being changed from a first impedance value to a relatively small impedance value in a variable fashion and (ii) being changed from the relatively small impedance value to the first impedance value in a variable fashion via one or more intermediate impedance values; and means for simultaneously receiving the signal as an input to a second of the passive impedance devices, an impedance value of the second passive impedance device (i) being changed from a relatively small impedance value to a second impedance value in a variable fashion and (ii) being changed from the second impedance value to the relatively small impedance value in a variable fashion via one or more intermediate impedance values;

wherein the impedance values of the first and second passive impedances devices are changed in synchronism, in accordance with a shape of a desirable output waveform.

15. The apparatus of claim 14, wherein the impedance value of the first and the second passive impedance device is changed based upon one or more demodulation coefficients.

16. The apparatus of claim 15, wherein said one or more demodulation coefficients are programmable.

17. The apparatus of claim 14, wherein at least one of the first and the second impedance device includes a resistor ladder.

* * * * *